United States Patent [19]
Haas et al.

[11] 4,021,665
[45] May 3, 1977

[54] LIGHT BEAM SWITCH HOUSING STRUCTURE

[75] Inventors: Klaus Dieter Haas; Manfred Sillmann, both of Emmendingen, Germany

[73] Assignee: Erwin Sick GmbH Optik-Electronik, Waldkirch, Germany

[22] Filed: Oct. 22, 1975

[21] Appl. No.: 624,584

[30] Foreign Application Priority Data

Nov. 8, 1974 Germany .......................... 2453097

[52] U.S. Cl. .............................................. 250/239
[51] Int. Cl.² .......................................... H01J 5/02
[58] Field of Search .......... 250/239, 221, 222, 223, 250/203

[56] References Cited
UNITED STATES PATENTS

| | | | |
|---|---|---|---|
| 2,562,538 | 7/1951 | Dyer | 250/239 |
| 3,341,710 | 9/1967 | Cade | 250/239 |
| 3,390,388 | 6/1968 | Kahl et al. | 250/239 |
| 3,524,068 | 8/1970 | Zorn | 250/239 |
| 3,857,639 | 12/1974 | Mason | 250/239 |
| 3,870,878 | 3/1975 | Walter et al. | 250/239 |

*Primary Examiner*—David C. Nelms

[57] ABSTRACT

Light beam switch unit containing source and/or receiver in a pressure-tight housing with sealed-in lenses, cover and cable inlet.

14 Claims, 6 Drawing Figures

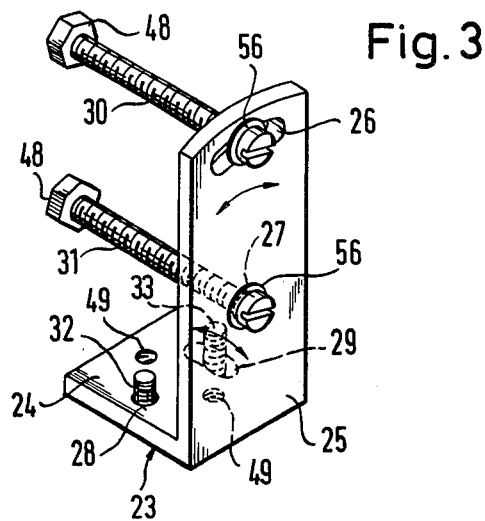
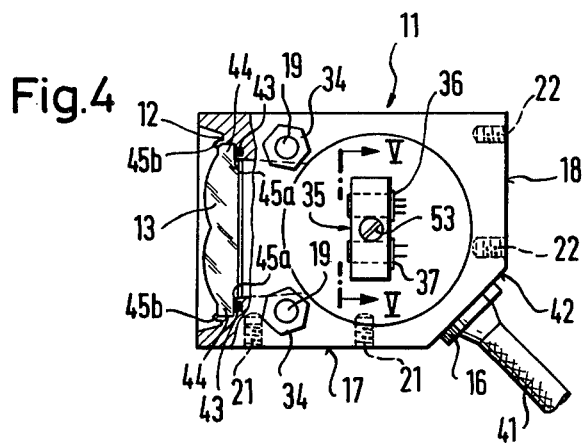
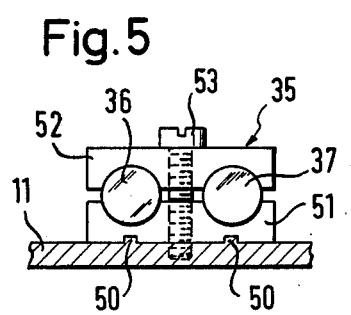
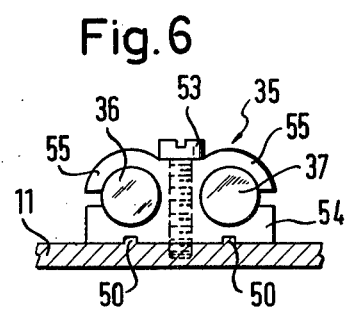

LIGHT BEAM SWITCH HOUSING STRUCTURE

The invention relates to a light beam switch unit comprising a housing in which a light source and/or a photo-receiver are disposed and in one wall of which one or two lenses are disposed which are aligned with the light source and/or photo-receiver, an electric cable being introduced into the housing, which also has means for the adjustable mounting of the housing.

A large number of light beam switches are known and have been in use for many years. In the case of the autocollimation light barrier the transmitter and receiver are accommodated in the same casing. The reflector is disposed a certain distance from the casing.

The adjustment of transmitter and receiver in normal light beam switches, or of the transmitter/receiver in relation to the reflector in the case of autocollimation light switches, nevertheless entails certain difficulties in practice. Another difficulty consists in particular in protecting the interior of the casing against detrimental environmental influences, such as atmospheric humidity, dust, etc. In order, for example, to use a light beam switch in a washing machine, very heavy expense was hitherto necessary to ensure that operation was not impaired by the penetration of moisture.

The object of the invention is thus a light beam switch of the kind first indicated above, which while economical to produce and of simple construction and compact arrangement, is effectively protected against environmental influences, such as moisture or dust, so that good operational reliability is ensured even after a long operating life. In addition, installation and adjustment should be possible without problems occurring.

For the purpose of fulfilling this object I propose according to the invention to construct the casing as a pressure-tight unit which in one wall contains the sealingly inserted lens or lenses and in another wall contains a sealingly inserted cover and a leakproof cable inlet. The casing is preferably in the form of a pressure diecasting. Due to this construction only a limited number of places require sealing, so that by simple means, for example by the use of sealing rings, absolutely tight closure of the interior of the casing in relation to the exterior is ensured.

In another preferred embodiment, which is important even without the leakproof construction, the substantially box-shaped casing contains in one wall the lens or lenses and in the same wall, and/or in walls parallel or perpendicular thereto, contains fastening means for mounting the casing on a holder. The fastening means are, however, preferably in the form of holes, threaded bores, or threaded pins so disposed that no connection is made between the exterior and the interior of the casing, so that the pressure-tightness of the casing is in no way impaired by the provision of the fastening means. Because the fastening means are disposed in the various walls of the casing and are preferably so arranged that the fastening pins project at right angles from the walls in question, accurate adjustment is possible by turning the casing about some of the fastening means which serve as axes of rotation.

The combination of the leakproof casing construction with the fastening means which do not impair tightness is particularly advantageous, because in this manner not only universal utilisability but also great accuracy of adjustment are ensured.

In a preferred embodiment two walls perpendicular to one another and to the wall carrying the lens or lenses each contain two fastening means by which the casing is pivotable about a vertical axis and about a transverse axis but can be locked in position on the holder carrying it. In conjunction with a casing of shallow construction another embodiment is characterised in that the flat side has two bores sealingly passing through the casing and the upper and lower faces have two threaded blind holes, the holder being in the form of a right angle and having on each arm two apertures for the passage of the fastening pins. One of the apertures in each arm should in each case be in the form of a circular hole and the other in the form of a slot having the shape of an arc or a circle with the appertaining circular hole as its center.

In this manner the turning of the casing about vertical and transverse axes can be achieved in a simple manner. By subsequently tightening the bolts or nuts the adjustment thereby achieved can be reliably fixed.

The two circular holes are preferably situated as close as possible to one another. This means that the two axes of rotation lie as close as possible to one another, so that tilting resulting from the adjustment is to a large extent avoided.

The bores in the flat side expediently lead into hexagonal widened portions, so that hexagonal nuts fitting therein and screwed on the fastening bolts are secured against turning on the operation of the bolts. The adjustment of the light beam switch according to the invention can thus be effected in the simplest manner with the sole aid of a screwdriver.

Additional threaded bores, which are expediently disposed one above the other in each case, may also be provided in the wall carrying the lens or lenses or in the rear wall parallel thereto. In this way the light beam switch of the invention can also be mounted on surfaces extending parallel to the lens surface, in which case adjustment about the optical axis or about an axis extending parallel thereto can be achieved by making the mounting holes in the form of a circular hole and an annular slot.

In one side, preferably the flat side, a screw cover, extending over a large area and permitting easy access to the interior of the casing, is preferably provided. The screw cover is preferably sealed in relation to the outside by means of a sealing ring.

In another embodiment the mounting means for the light source and/or the photo-receiver is provided in the region of the cover. By removing the screw cover it is thus possible for the parts which are particularly important for the functioning of the light beam switch to be mounted without difficulty and with accurate adjustment.

If the light beam switch of the invention comprises a light source and a photo-receiver, that is to say, if it is an autocollimation light barrier, the lenses are expediently disposed one above the other in a narrow wall of the casing, and the light source and photo-receiver are disposed one above the other in the mounting means, which can be fixed by means of a screw.

In addition, provision may be made for an operating element of a sensitivity adjuster and/or an indicator lamp to be passed sealingly through a narrow wall, preferably the top narrow wall. In this embodiment the correct functioning of the light barrier can be observed directly by means of the indicator lamp, while the operating element is readily accessible.

The invention is described below by way of example and with reference to the accompanying drawings, in which:

FIG. 3 is a view in perspective of a holder for the light beam switch shown in FIG. 1;

FIG. 4 is a side view of the light beam switch of FIG. 1, with the lid open;

FIG. 5 is a section on the line V—V in FIG. 4, showing a first form of construction of the mounting means; and FIG. 6 is a section on the line V—V in FIG. 5, showing however, a second form of construction of the mounting means.

Figure 1:
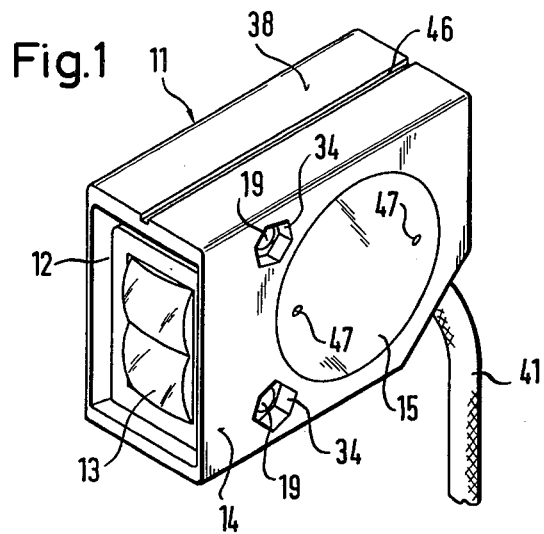
FIG. 1 is a diagrammatical view in perspective of a first form of construction of a light beam switch according to the invention.
Figure 2:
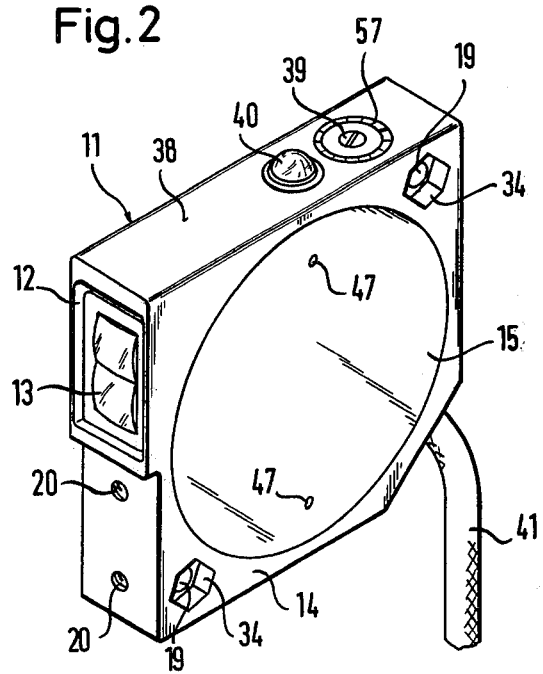
FIG. 2 is a view in perspective of another form of construction.

According to FIGS. 1 and 2, a light beam switch casing 11, preferably in the form of a pressure diecasting, is in the form of a shallow rectangular box, which at the rear bottom end is flattened in the manner particularly visible in FIG. 4, in order to permit the introduction of the electric supply cable 41 at this point. The inclined surface 42 preferably extends at an angle of 45° to the neighbouring walls 17, 18, the cable inlet 16 being absolutely watertight as the result of watertight screw connection or adhesive bonding.

The front wall 12 contains a rectangular aperture in which two front lenses 13, made in one piece and flanged to achieve tightness to pressurized water, are inserted.

According to FIG. 4, the double lens 13 is fixed by its projecting edges 44 between a supporting edge 45a and a flanged edge 45b. The sealing ring 43 inserted in a groove in the casing ensures watertight sealing.

In one flat side 14 of the casing is mounted a circular screwable cover 15, which is mounted watertightly by means of a sealing ring (not shown). The cover is opened and closed by means of a special key, which is inserted in two oppositely situated blind holes 47. In this way unauthorised opening of the casing is to a large extent prevented. The screwcover 15 extends over the major part of the flat side 14, so that the interior of the casing is readily accessible without any risk of penetration of moisture or dust. In the upper surface 38 of the casing 11 is formed a sighting groove which extends parallel to the optical axis and by means of which a reflector disposed at a distance from the casing, preferably a triple reflector or a reflector made of retroreflective material, can be sighted for adjustment purposes. This is therefore a measure which can be carried out extremely simply but which nevertheless leads to entirely satisfactory adjustment.

Passages 19, which however, are not in communication with the interior of the casing so that leaks also cannot occur at these points, extend from one flat side 14 to the opposite flat side. The passages 19 lead on both sides into hexagonal widened portions 34, which in a manner to be described later on serve to receive hexagonal nuts. In the embodiment shown in FIG. 1, the passages 19 extending at right angles to the flat side 14 are situated one above the other in the front region of the casing 11, whereas in the embodiment shown in FIG. 2 they are disposed diagonally.

According to FIG. 4, moreover, threaded blind holes 21 are provided one behind the other in the bottom surface 17, while two threaded blind holes 22 are likewise disposed one above the other in the rear wall 18.

In the embodiment shown in FIG. 2, the casing 11 extends a certain distance below the double lens 13, so that in the front wall 12 there is also still space to accommodate two threaded blind holes 20 disposed one above the other.

FIG. 3 shows a holder 23 which serves for the adjustable fastening of the light beam switch shown in FIG. 1. The holder 23 is in the form of a right angle, in each of whose arms 24, 25 there are disposed circular holes 27, 28, respectively and, at a distance therefrom annular slot holes 26, 29. Threaded bolts 30, 31, 32 and 33 respectively extend through these holes and serve to engage in the portions 34 of passages 19 or the blind bores 21 in the light beam switch shown in FIGS. 1 and 4. The nuts 48 come to lie in the hexagonal widened portions 34 which are provided on the flat side not visible in FIG. 1. Additional bores 49 are provided in the arm 24 to fasten the holder 23 to a fixed component.

After the light beam switch shown in FIG. 1 has been screwed to the holder shown in FIG. 3, and before the bolts have been completely tightened, the switch can be turned a certain extent about a vertical axis and about a transverse axis until the correct adjustment, which is for example, ascertained by means of the sighting groove 46, has been found. This adjustment can then be fixed particularly by tightening the bolts 31, 32, for the entire operating life of the light beam switch. A certain play is preferably allowed for the bolts 30, 31 in the apertures 19, so that any slight tilting which may occur during adjustment can be corrected.

According to FIGS. 4 to 6, the light source 36 and the photo-receiver 37 are clamped in a mounting means 35, which may be constructed as shown in FIGS. 5 or 6. In the embodiment shown in FIG. 5, the preferably cylindrical optical elements are clamped between a lower part 51, which is mounted on the casing 11 and rotationally fixed by means of projections and depressions 50, and an upper part 52, a single screw 53 ensuring the clamping of the optical parts 36, 37 between the two halves 51, 52. The interior shape of the two halves 51, 52 is adapted to the exterior shape of the optical components 36, 37.

In the embodiment shown in FIG. 6, the mounting means 35 consists of a single piece 54, which is once again mounted and rotationally fixed on the casing 11 by means of projections and depressions and fastened by means of a single screw 53. In its upper region the part 54 however, has spring tongues 55, which engage over the light source 36 or photo-receiver 37 and are pressed against these parts on the tightening of the screw 53. The mounting means 35, which are of extremely simple construction and can without difficulty be fitted even by unskilled labour, ensure completely accurate arrangement of the optical parts 36, 37 in relation to the lenses 13. In this respect the construction and arrangement of the mounting means 35 contribute substantially to the provision of an operationally reliable light barrier which nevertheless is simple to produce.

In the embodiment shown in FIG. 2, an indicator lamp 40 and an operating element 39 for a sensitivity regulator (not shown) are also provided. The elements 39, 40, are also fitted to the casing in a pressure-tight manner.

The operating elements 39 may furthermore expediently be surrounded by a scale 55 which is fastened on the top wall 38 of the casing 11.

The indicator lamp 40 is dome-shaped, so that the indication can be seen from several sides. Both the operating element 39 and the indicator lamp 40 are installed in watertight manner by means of sealing rings.

The bolts 30 to 33 in FIG. 3 are conveniently secured against turning, preferably by means of washers 56 or additional screw securing elements, such as spring rings, or the like, when they are fastened.

A semi-conductor diode is preferably used as light source 36, and a photo-transistor as photo-receiver 37.

At their connection ends the light source 36 and the photo-receiver 37 respectively, preferably have stops so that, when they are pushed into the mounting means 35 as far as the respective stop and when the screw is tightened, they are immediately completely adjusted.

What is claimed is:

1. A light beam switch having a substantially rectangularly box-shaped, pressure-tight housing with a plurality of walls and containing at least one optical component with an optical axis, lens means disposed in one wall of said housing in sealing engagement therewith and aligned with each said component, two fastening means in each of two walls at right angles to one another and to said one wall, and a holder with means for receiving said two fastening means and connecting said housing to said holder and for pivotably adjusting said housing with respect to said holder about a first axis perpendicular to said optical axis and a second axis transverse to said first and optical axes.

2. A light beam switch according to claim 1, wherein one of said two walls contains two passages passing through the housing from one external side to the other and being sealed from the interior of the housing, and the other of said two walls having two threaded blind holes, said holder being in the form of a right angle and having in each arm two apertures for the passage of said fastening means operatively associated with said passages and holes.

3. A light beam switch according to claim 2, wherein one of the two apertures in each arm is in the form of a circular hole and the other in the form of a slot in the shape of an arc of a circle having as its center the associated circular hole.

4. A light beam switch according to claim 3, wherein the two circular holes are situated relatively close to one another.

5. A light beam switch according to claim 2, wherein said passages open out into hexagonal widened portions.

6. A light beam switch according to claim 2, wherein said one wall is provided with additional threaded bores.

7. A light beam switch according to claim 2, wherein the wall parallel to said one wall is provided with additional threaded bores.

8. A light beam switch according to claim 6, wherein the additional threaded bores are disposed one above the other.

9. A light beam switch according to claim 7, wherein the additional threaded bores are disposed one above the other.

10. A light beam switch according to claim 1, wherein a screw cover is provided in one of said two walls.

11. A light beam switch according to claim 1, wherein the region of said cover a mounting means for said at least one optical component is provided.

12. A light beam switch accordng to claim 1, comprising a light source and a photo-receiver, said housing having two parallel relatively narrow walls, and wherein said lens means comprises two lenses disposed one above the other in one of said narrow walls, the light source and the photo-receiver being disposed one above the other in said mounting means, and a screw fixing said mounting means to said housing.

13. A light beam switch accordng to claim 1, comprising an operating element and an indicator lamp passed through one of said walls and in sealing engagement therewith.

14. A light beam switch according to claim 1, comprising a sighting groove extending parallel to the optical axis of said optical component in the upper surface of said housing.

* * * * *